United States Patent [19]
Miller et al.

[11] Patent Number: 6,136,719
[45] Date of Patent: Oct. 24, 2000

[54] METHOD AND ARRANGEMENT FOR FABRICATING A SEMICONDUCTOR DEVICE

[75] Inventors: Gayle W. Miller; Gail D. Shelton, both of Colorado Springs, Colo.

[73] Assignee: LSI Logic Corporation, Milpitas, Calif.

[21] Appl. No.: 09/302,830

[22] Filed: Apr. 30, 1999

[51] Int. Cl.$^7$ .................................................. H01L 21/00
[52] U.S. Cl. .......................... 438/707; 156/345; 216/59; 216/62; 438/8; 438/705; 438/725
[58] Field of Search ............................. 438/8, 9, 14, 705, 438/707, 725; 156/345 V, 345 MT; 216/59, 84, 60, 85, 61, 86, 62, 87; 430/30, 327, 395, 494, 944

[56] References Cited

U.S. PATENT DOCUMENTS

| | | | |
|---|---|---|---|
| 4,198,261 | 4/1980 | Busta et al. | 156/626 |
| 4,482,424 | 11/1984 | Katzir et al. | 156/626 |
| 4,822,718 | 4/1989 | Latham et al. | 430/271 |
| 4,846,920 | 7/1989 | Keller et al. | 156/345 |
| 4,998,021 | 3/1991 | Mimasaka | 250/560 |
| 5,139,918 | 8/1992 | Goel | 430/166 |
| 5,190,614 | 3/1993 | Leach et al. | 156/626 |
| 5,198,072 | 3/1993 | Gabriel | 156/627 |
| 5,261,998 | 11/1993 | Kanetake et al. | 156/626 |
| 5,288,367 | 2/1994 | Angell et al. | 156/626 |
| 5,392,124 | 2/1995 | Barbee et al. | 356/381 |
| 5,427,878 | 6/1995 | Corliss | 430/30 |
| 5,641,608 | 6/1997 | Grunwald et al. | 430/302 |
| 5,643,700 | 7/1997 | Otsuka | 430/30 |
| 5,658,418 | 8/1997 | Coronel et al. | 156/345 |
| 5,695,660 | 12/1997 | Litvak | 216/85 |
| 5,731,123 | 3/1998 | Kawamura et al. | 430/176 |
| 5,773,206 | 6/1998 | Hershey et al. | 430/510 |
| 5,777,739 | 7/1998 | Sandhu et al. | 356/357 |
| 5,814,431 | 9/1998 | Nagasaka et al. | 430/281.1 |

*Primary Examiner*—William Powell

[57] ABSTRACT

A method of fabricating a semiconductor wafer is disclosed. The method includes the steps of (i) doping a resist substance with an electromagnetic radiation absorbing compound so as to form an electromagnetic radiation absorbing resist material, (ii) forming an electromagnetic radiation absorbing resist layer on a first side of the semiconductor wafer with the electromagnetic radiation absorbing material, (iii) subjecting the first side of the semiconductor wafer to an electromagnetic signal so that an amount of the electromagnetic signal is absorbed by the electromagnetic radiation absorbing compound present in the electromagnetic radiation absorbing resist layer such that an attenuated electromagnetic signal emanates from the semiconductor wafer, (iv) etching the first side of the semiconductor wafer during the subjecting step in order to remove a quantity of the electromagnetic radiation absorbing resist layer from the first side of the semiconductor wafer, (v) determining an intensity level of the attenuated electromagnetic signal, and (vi) stopping the etching step in response to the intensity level of the attenuated electromagnetic signal having a predetermined relationship with an intensity threshold level. An associated arrangement for etching a first side of a semiconductor wafer down to a desired level is also disclosed.

20 Claims, 5 Drawing Sheets

METHOD AND ARRANGEMENT FOR FABRICATING A SEMICONDUCTOR DEVICE

CROSS REFERENCE

Cross reference is made to copending U.S. patent application Ser. No. 09/204,767, entitled "Apparatus and Method for Detecting an Endpoint of an Etching Process by Transmitting Infrared Light Signals Through a Semiconductor Wafer" by Taravade et al.

TECHNICAL FIELD OF THE INVENTION

The present invention relates generally to a method and arrangement for fabricating a semiconductor device, such as a semiconductor wafer, and more particularly to a method and arrangement for detecting an endpoint of an etching process.

BACKGROUND OF THE INVENTION

There is a continuing trend in the semiconductor industry to increase the functionality and performance of integrated circuit devices by increasing the number of circuit components within a given integrated circuit device. While in certain cases this may be accomplished by increasing the size of the integrated circuit device, in most cases this is accomplished by reducing the size and increasing the density of the circuit components.

Lithographic processes play an important role in achieving the above described goals in the manufacture of semiconductor devices. In particular, during the manufacture of these devices lithographic processes are used to pattern substrates, such as, silicon wafers or processed silicon wafers which are wholly or partially covered by metal, silicon dioxide or polysilicon. Typically, a substrate is patterned by coating the substrate with an energy-sensitive material called a resist. Selected portions of the resist are exposed to a form of energy which induces a change in the solubility of the exposed portions in relation to a given developing agent or etchant. The more soluble portions of the resist are then removed by etching (developing) the resist with a wet chemical etchant or by utilizing a dry etching process, e.g., plasma etching or reactive ion etching. The resulting pattern defined in the resist is then transferred into the underlying substrate by, for example, etching or metallizing the substrate through the patterned resist.

The utilization of the aforementioned dry etching processes are particularly desirable since they do not require the immersion of the semiconductor wafer into an etching liquid. The most common dry etch process, generally referred to as "plasma etching", utilizes plasma to etch films on the semiconductor wafer. Another type of dry etching, generally referred to as "dry developing", utilizes a reactant gas to etch resist films from the semiconductor wafer.

In such dry etch processes, it is generally desirable to predict or detect when the desired layer of material associated with the semiconductor wafer has been etched away. In particular, it is desirable to detect when the semiconductor wafer has been etched to a desired level or "endpoint". For example, systems have heretofore been designed which monitor the emission spectra of the plasma during plasma etching. Included among these are mass-spectrometric and optical interferometric techniques. In the former technique, mass spectrometric analysis of, for example, an etching plasma is employed to determine resist etch end point. That is, for example, once a reaction product typical of the substrate is detected in the mass-spectrometric analysis of the plasma, then the interface between the resist and the substrate is assumed to have been reached, and the etching is discontinued. While this technique is useful, the time resolution inherent in the analysis of reaction products, and thus the accuracy in the determination of the etch end point, is limited by the etch rate of the substrate and by the diffusion times of substrate reaction products to a detector. As a consequence, the determination of etch end point can be in error by up to several minutes. At typical plasma etch rates (of about 500 Angstroms per minute), such errors in the end point determination correspond to at least several hundred Angstroms, and often several thousand Angstroms, of the resist film thickness (typically only 1–2 $\mu$m thick), which is very a significant fraction of the resist thickness, and thus a very significant error in the determination of etch end point.

With typical optical interferometric techniques, light is shined on the resist undergoing etching, and a portion of the reflected light is detected. In addition, the intensity of the reflected light is recorded. As is known, the intensity of the reflected light oscillates periodically with time (as resist thickness is reduced) because of successive constructive and destructive interferences between light rays reflected from the bottom of the grooves being etched into the resist and light rays reflected from the underlying interface between the resist and the substrate. Etch end point is generally detected by looking for sharp changes in slope, or sharp changes in the oscillation frequency, of the detected signal. However, the slope of the output signal does not always change abruptly at the end point, particularly if the substrate has optical properties similar to those of the resist, i.e., if the index of refraction of the substrate is approximately equal to that of the resist. In this case, the etch end point may also be in error by an equivalent resist thickness of at least several hundred Angstroms, and often as much as several thousand Angstroms.

In addition to the aforementioned problems, these mass-spectrometric and optical interferometric systems are typically complex and require expensive analysis equipment for the operation thereof.

Thus, a continuing need exists for a method and arrangement which accurately and efficiently detects when an etching system etches a semiconductor wafer down to a desired level.

SUMMARY OF THE INVENTION

In accordance with a first embodiment of the present invention, there is provided a method of fabricating a semiconductor wafer. The method includes the steps of (i) doping a resist substance with an electromagnetic radiation absorbing compound so as to form an electromagnetic radiation absorbing resist material, (ii) forming an electromagnetic radiation absorbing resist layer on a first side of the semiconductor wafer with the electromagnetic radiation absorbing material, (iii) subjecting the first side of the semiconductor wafer to an electromagnetic signal so that an amount of the electromagnetic signal is absorbed by the electromagnetic radiation absorbing compound present in the electromagnetic radiation absorbing resist layer such that an attenuated electromagnetic signal emanates from the semiconductor wafer, (iv) etching the first side of the semiconductor wafer during the subjecting step in order to remove a quantity of the electromagnetic radiation absorbing resist layer from the first side of the semiconductor wafer, (v) determining an intensity level of the attenuated electromagnetic signal, and (vi) stopping the etching step in response to the intensity level of the attenuated electromagnetic signal having a predetermined relationship with an intensity threshold level.

Pursuant to a second embodiment of the present invention, there is provided a method of fabricating a semiconductor wafer. The method includes the steps of (i) forming an infrared radiation absorbing resist layer on a first side of the semiconductor wafer, (ii) subjecting the first side of the semiconductor wafer to an infrared signal so that an amount of the infrared signal is absorbed by the infrared radiation absorbing resist layer such that an attenuated infrared signal emanates from the semiconductor wafer, (iii) etching the first side of the semiconductor wafer during the subjecting step in order to remove a quantity of the infrared radiation absorbing resist layer from the first side of the semiconductor wafer, (iv) determining an intensity level of the attenuated infrared signal, and (v) stopping the etching step in response to the intensity level of the attenuated infrared signal having a predetermined relationship with an intensity threshold level.

Pursuant to a third embodiment of the present invention, there is provided an arrangement for etching a first side of a semiconductor wafer down to a desired level. The arrangement includes an etching system for etching the first side of the semiconductor wafer. The etching system is operable between (i) an etching mode wherein the etching system etches the first side of the semiconductor wafer and (ii) a non-etching mode wherein the etching system stops etching the first side of the semiconductor wafer. The arrangement also includes an electromagnetic radiation absorbing resist material disposed on the first side of the semiconductor wafer. The arrangement further includes a light source unit for subjecting the electromagnetic radiation absorbing resist material to an electromagnetic signal such that (i) an amount of the electromagnetic signal is absorbed by the electromagnetic radiation absorbing resist material and (ii) an attenuated electromagnetic signal emanates from the semiconductor wafer. The arrangement also includes a light receiving unit for receiving the attenuated electromagnetic signal. The light receiving unit is operably coupled to the etching system so that the etching system is placed in the non-etching mode when the attenuated electromagnetic signal has a predetermined relationship with an intensity threshold level.

It is an object of the present invention to provide a new and useful method and arrangement for determining an endpoint of an etching process.

It is an object of the present invention to provide an improved method and arrangement for determining an endpoint of an etching process.

It is a further object of the present invention to provide a method and arrangement for determining that an etching system has etched a semiconductor wafer down to a desired level without removing the semiconductor wafer from the etching system.

The above and other objects, features, and advantages of the present invention will become apparent from the following description and the attached drawings.

DETAILED DESCRIPTION OF A PREFERRED EMBODIMENT

Figure 1A:
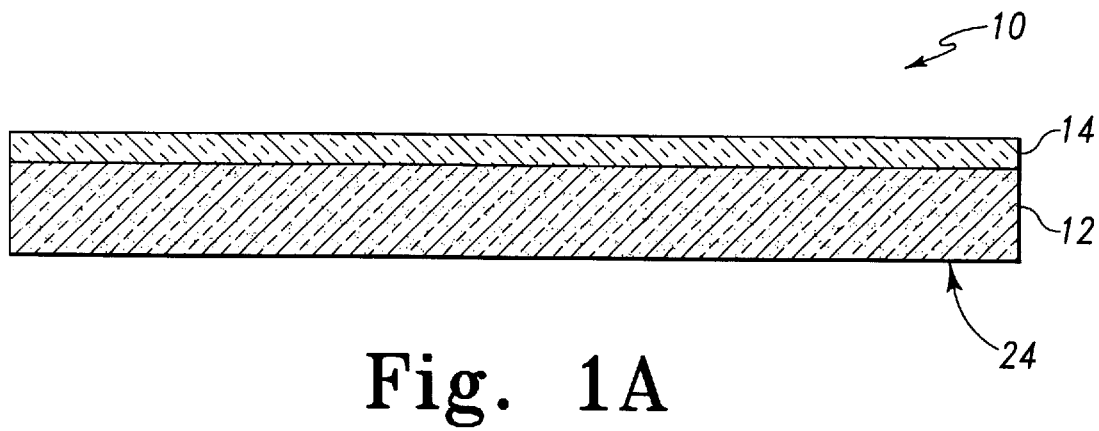
FIGS. 1A–1D show sectional views of a semiconductor wafer during various steps of a fabrication process.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 1B:
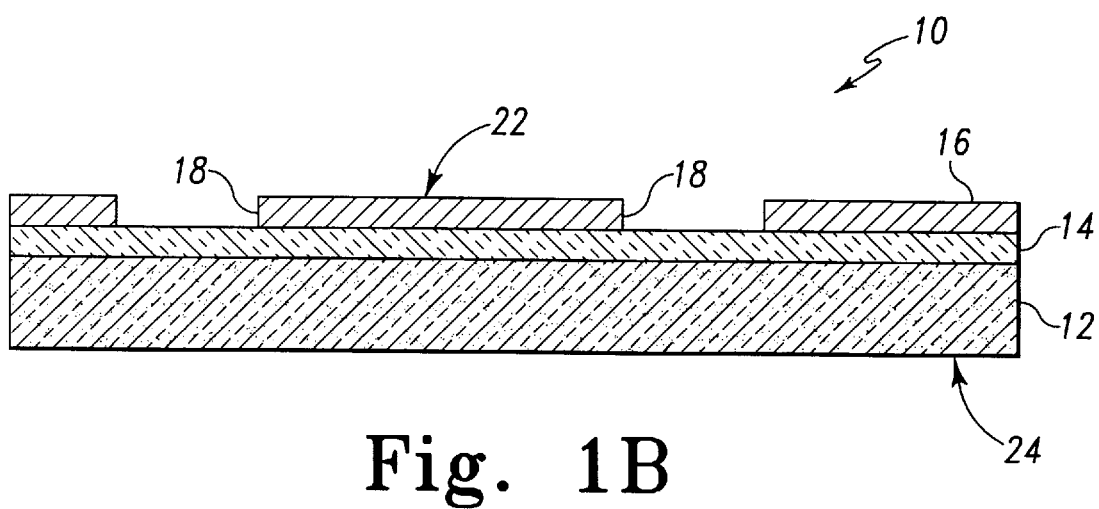
Figure 4:
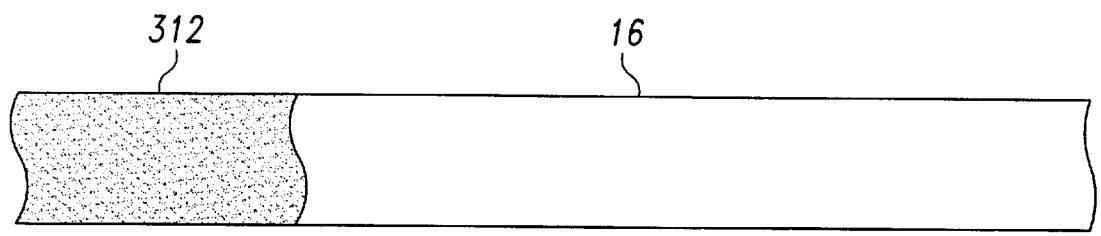
FIG. 4 shows an enlarged fragmentary schematic view of a resist substance after being physically mixed with an electromagnetic radiation absorbing compound to form an electromagnetic radiation absorbing resist layer (note that only a portion of the resist substance is shown mixed with the electromagnetic radiation absorbing compound for clarity of description).

Referring now to FIGS. 1A–1D, there is shown a semiconductor wafer 10 after various steps of a fabrication process of the present invention. As shown in FIGS. 1A and 1B, the semiconductor wafer 10 includes a semiconductor substrate 12, such as silicon. An oxide layer 14 (e.g. silicon dioxide) is initially deposited or otherwise disposed on the semiconductor substrate 12. Thereafter, the fabrication process patterns an electromagnetic radiation absorbing resist layer 16 over the oxide layer 14. In particular, the resist layer 16 is patterned onto the oxide layer such that a pair of holes 18 are defined therein. The electromagnetic radiation absorbing resist layer 16 (hereinafter referred to as resist layer 16) is formed by doping (i.e. physically mixing one substance with another) a resist substance with an electromagnetic radiation absorbing compound 312 (see FIG. 4) so as to form the resist layer 16. In particular, as shown in FIG. 4, doping a resist substance with an electromagnetic radiation absorbing compound 312 results in the electromagnetic radiation absorbing compound 312 being homogeneously dispersed in the resist substance. Note that only a portion of the resist substance is shown having the electromagnetic radiation absorbing compound 312 dispersed therein for clarity of description. Preferably, the electromagnetic radiation absorbing compound 312 is a substance showing absorption in the infrared regions (i.e. about 700–1000 nm) of the electromagnetic spectrum. Examples of substances which can be used as the electromagnetic radiation absorbing compound 312 in the present invention include Sudan Black B (1 H-Perimidine, 2,3-dihydro-2, 2-dimethyl-6-[[4-(phenylazo)-1-naphthyl]azo]) which is commercially available from the Aldrich Corporation located in Milwaukee, Wis., as product number 199664. Further examples of electromagnetic radiation absorbing compound 312 which can be used in the present invention include (note that the chemical formula and the maximum absorption wave length in the infrared region is also provided):

(1) Quinone series dye
  1-1: 8-phenylamino-5-amino-2,3-dicyano-1,4-naphthoquinone (758, 735)

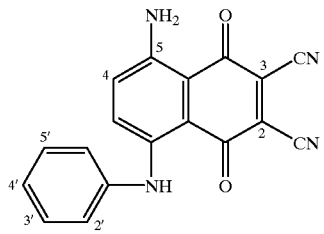

1-2: 8-(4'-methylphenylamino)-5-amino 2,2,3-cyano-1,4-naphthoquinone (4'-Me)C$_{19}$H$_{12}$N$_4$)$_2$(760)
  1-3: 8-(4'-methoxyphenyl)-5-amino-2,3,-dicyano-1,4-naphthoquinone (4'-OMe)C$_{19}$H$_{12}$N$_4$O$_2$(760)
  1-4: 8-(4'-chlorophenylamino)-5-amino-2,3-dicyano-amino-1,4-naphthoquinone (4'-Cl)C$_{18}$H$_{19}$H$_4$O$_2$Cl (348.5) (758)
  1-5: 8-(4'-dimethylaminophenylamino)-5-amino-2,3-dicyano-1,4-naphthoquinone (4'-NH$_2$)C$_{20}$H$_{15}$N$_5$)$_2$ (802)
  1-6: (5,10-(NHPh)$_2$)C$_{28}$H$_{18}$N$_2$O$_2$(703)
  1-7: 2-anilino-3,4-phthaloylacridone (2-NHPh) C$_{27}$H$_{18}$N$_2$O$_3$(721)
  1-8: 2-(4-toluidino)-3,4-phthaloylacridone (2-NHC$_6$H$_4$Me-(m))C$_{28}$H$_{18}$O$_3$(718)
  1-9: 2-(4-anisidino)-3,4-phthaloylacridone (2-NHC$_6$H$_4$Me-(p))C$_{28}$H$_{28}$N$_2$O$_4$(732)
  1-10: 2-(3-chloroanilino)-3,4-phthaloylacridone (2-NHC$_6$H$_4$Cl-(m))C$_{27}$H$_{15}$N$_2$O$_3$Cl(707)
  1-11: 2-(4-chloroanilino)-3,4-phthaloylacridone (2-NHC$_6$H$_4$Cl-(p))C$_{27}$H$_{15}$N$_2$O$_3$Cl(718)
  1-12: 2-(3-nitroanilino)-3,4-phthaloylacridone (2-NHC$_6$H$_4$NO$_2$(m))C$_{27}$H$_{15}$N$_3$O$_5$(695)
  1-13: 6,15-bis(4-anisidino)indanthrene (6,15-(NHC$_6$H$_4$OMe-(P))$_2$C$_{42}$H$_{28}$N$_4$O$_6$(715–720, 790)
  1-14: 6,15-bis(4-ethoxyanilino)indanthrene (6,15-(NHC$_6$H$_4$Et-(p))$_2$C$_{42}$H$_{32}$N$_4$O$_6$(720, 790)
(2) Polymethine series dye
  2-1: Bis(dimethylanino)streptopolymethinecyanine (C$_{17}$H$_{25}$Cl)(848)
  2-2: 3,3'-dimethyl-2,2'-thiatricarbocyanine iodide C$_{23}$H$_{21}$N$_2$IS$_2$(752)
  2-3: 3,3'-diethyl-2,2'-thiatricarbocyanine perchlorate C$_{23}$N$_{25}$N$_2$O$_4$ClS$_2$(773, 870)
  2-4: 3,3'-di(3-acetoxypropyl)-11-diphenylamino-10,10-ethylene-5,6,5',6'-dibenzothiatricarbocyanine perchlorate C$_{53}$H$_{48}$N$_3$O$_8$ClS$_2$(831, 972)
(3) Diphenylmethane series dye
  3-1: Phenylphenylvinylmethylum chloride C$_{23}$H$_{21}$Cl (714)
  3-2: (4-methoxyphenyl)-(4'-methoxyphenylvinyl) methylum chloride C$_{19}$H$_{21}$O$_2$Cl(725)
  3-3: (4-dimethylaminophenyl)-(4'-dimethylaminophenylvinyl) methylum chloride C$_{21}$H$_{25}$N$_2$Cl(790)
(4) Polyphine series dye
  4-1: Phthalocyanine C$_{32}$N$_{18}$N$_8$(700, 772)
  4-2: Triphenylphthalocyanine Sn complex (720)
  4-3: Triphenylphthalocyanine Pb complex (725)

Figure 1C:
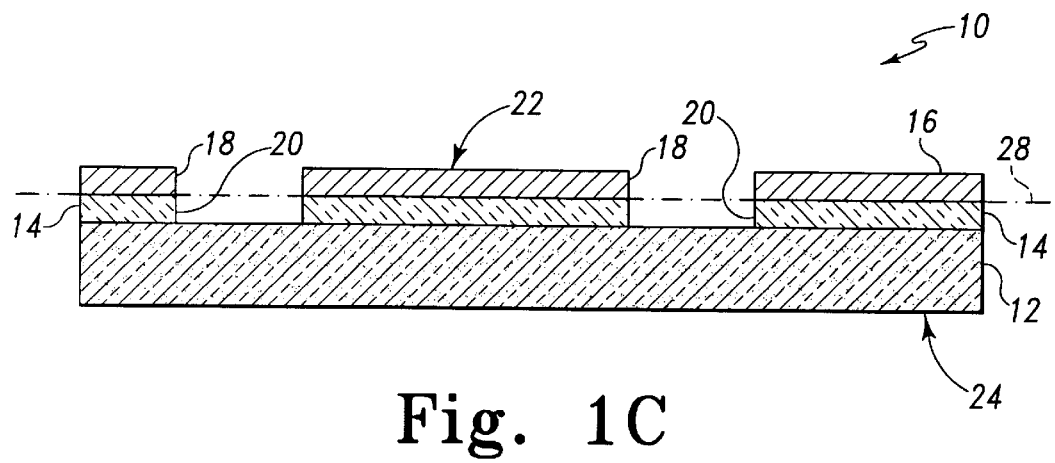
Figure 1D:
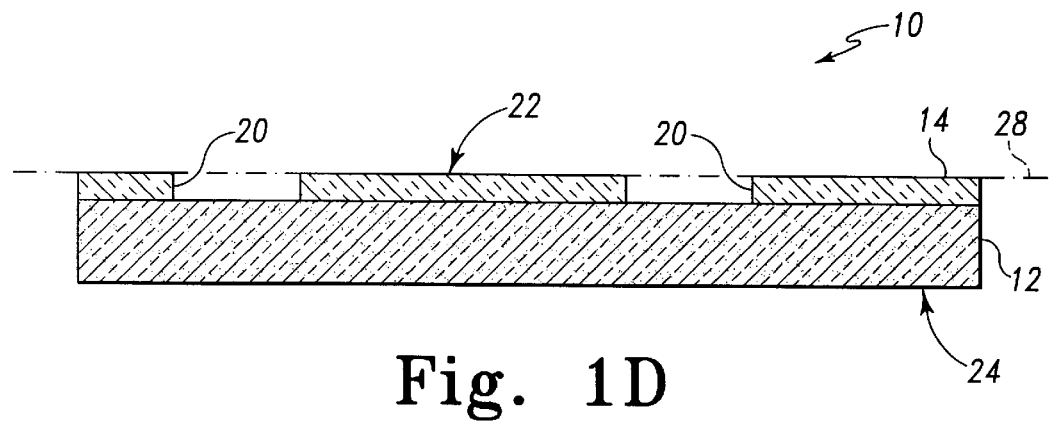

As shown in FIG. 1C, after the resist layer 16 is patterned onto the oxide layer in the above described manner the semiconductor wafer 10 is etched such that the portions of the oxide layer 14 not covered by the resist layer 16 (i.e. the portion of the oxide layer below the holes 18) are etched away thereby forming a pair of holes 20 in the oxide layer 14. After the holes 20 have been etched or otherwise defined in the oxide layer 14, it may be desirable to etch the remainder of the resist layer 16 from the semiconductor wafer 10. As shall be discussed below in more detail, in order to remove the remainder of the resist layer 16, an etching system, such as an etching system 30 of FIG. 2, etches the resist layer 14 down to a desired level 28 thereby removing substantially all of the resist layer 16 (see FIG. 1D).

Figure 2:
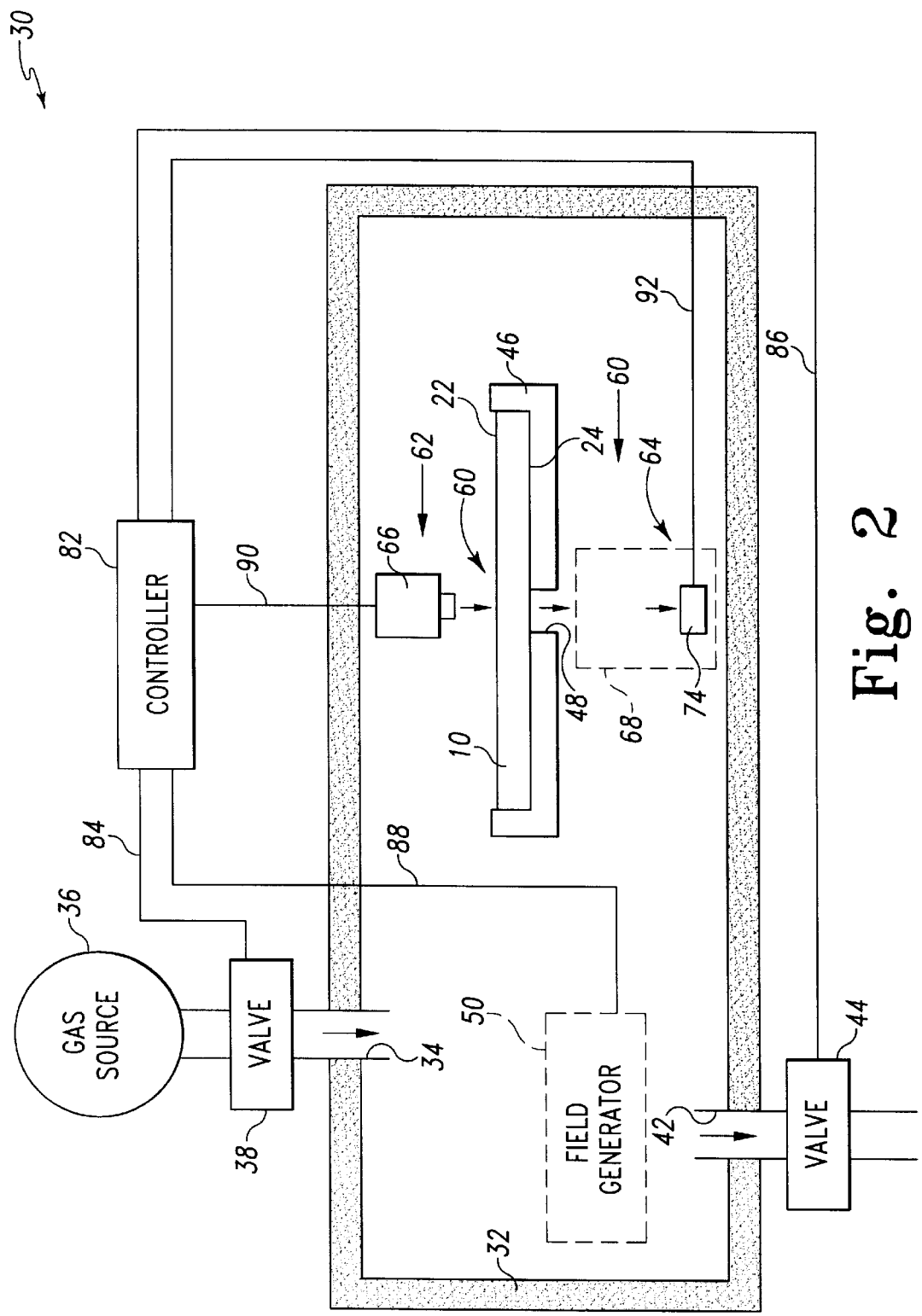
FIG. 2 shows an etching system which incorporates various features of the present invention therein.

Referring now to FIG. 2, there is shown a preferred embodiment of the etching system 30 which is used to etch a front side or surface 22 of the semiconductor wafer 10. The etching system 30 includes an etching chamber 32. The etching chamber 32 has a gas inlet 34 which is fluidly coupled to a gas source 36 in order to provide for a flow of a reactant gas (or gases) into the etching chamber 32. The gas inlet 34 has an inlet valve 38 associated therewith which controls the flow of reactant gas from the gas source 36. In particular, the inlet valve 38 is positionable between an open position and a closed position. When the inlet valve 38 is positioned in its open position, reactant gas is permitted to flow from the gas source 36 into the etching chamber 32. Conversely, when the inlet valve 38 is positioned in its closed position, the gas source 36 is isolated from the etching chamber 32 thereby preventing a flow of reactant gas into the etching chamber 32.

Moreover, the etching chamber 32 also has a gas outlet 42 which is fluidly coupled to a vacuum pump (not shown) and a gas collection device (not shown) in order to selectively (1) reduce pressure within the etching chamber 32 to a predetermined pressure level, and (2) evacuate the reactant gas from the etching chamber 32. The gas outlet 42 has an outlet valve 44 associated therewith which controls the flow of reactant gas from the etching chamber 32 to the gas collection device. In particular, the outlet valve 44 is positionable between an open position and a closed position. When the outlet valve 44 is positioned in its open position, reactant gas is permitted to flow from the etching chamber 32 to the gas collection device. Conversely, when the outlet valve 44 is positioned in its closed position, the etching chamber 32 is isolated from the gas disposal device thereby preventing a flow of reactant gas into the gas disposal device.

The etching system 30 also includes a wafer chuck 46 which engages a back side or surface 24 of the semiconductor wafer 10 and thereafter positions the wafer 10 at a predetermined position within the etching chamber 32. The wafer chuck 46 has an opening 48 defined therein. The opening 48 is provided to allow light signals (i.e. electromagnetic signals) to pass through the wafer chuck 46. It should be appreciated that the opening 48 may be covered with a protective covering so as to prevent gas or debris from advancing into the opening 48. As shall be discussed below in more detail, light signals advancing through the opening 48 may be utilized to determine when the semiconductor wafer 10 has been etched down to the desired level 28.

The wafer chuck 46 may have a cooling mechanism (not shown) associated therewith which counteracts heat generated during the etching process in order to maintain the back side 24 of the semiconductor wafer 10 within a predetermined temperature range.

The etching system 30 also includes an electric field generating device 50 for generating an electric field within the etching chamber 32. Such an electric field breaks down the reactant gases within the etching chamber 32 thereby generating a plasma. Reactive species within the plasma etch the wafer material that is desired to be removed (e.g. the remaining resist layer 16). In a known manner, the electric field generating device 50 may produce an electric field at various frequencies such as RF or microwave frequencies.

The etching system 30 further includes an endpoint detection system 60. As shown in FIG. 2, the endpoint detection system 60 includes a light source array 62 and a light receiver array 64. The light source array 62 is secured above the wafer chuck 46 and includes an infrared light source unit 66. In particular, the infrared light source unit 66 is secured within the etching chamber 32 such that infrared light signals generated by the light source unit 66 are directed toward the front side 22 of the semiconductor wafer 10. It should be appreciated that the infrared light source unit 66 may alternatively be secured outside of the etching chamber 32 such that infrared light signals are first directed through a sapphire window or the like positioned in an upper wall of the etching chamber 32 and thereafter impinged upon the front side 22 of the semiconductor wafer 10.

The light receiver array 64 includes a light receiving unit 68 that is secured to or otherwise positioned below the wafer chuck 46. In particular, the light receiving unit 68 is positioned such that light signals emanating out of the opening 48 defined in the wafer chuck 46 are received by the light receiving unit 68. As discussed further below, the intensity level of light signals received by the light receiving unit 68 may be monitored in order to determine when the semiconductor wafer 10 has been etched down to the desired level 28 (see FIG. 1C).

As shown in FIG. 2, the light receiving unit 68 includes an infrared light detector 74. Infrared light signals from light source unit 66 pass through the opening 48 of the wafer chuck 46 and are received in light detector 74.

It should be appreciated that the light source unit 66 is configured to produce infrared light at an intensity level which facilitates endpoint detection of he semiconductor wafer 10 during etching thereof. In particular, the light source unit 66 produces infrared light which passes through the resist layer 16 layered on semiconductor wafer 10. The intensity level of the infrared light is attenuated or otherwise reduced as the light passes through the semiconductor wafer 10. It should be understood that the infrared light is particularly attenuated as it passes through the resist layer 16 since an amount of the infrared light is absorbed by the electromagnetic radiation absorbing compound 312 present in the resist layer 16. It should also be understood that the attenuated infrared light has the same wavelength as the infrared light being emitted from light source unit 66. For example, if light source 66 is emitting an electromagnetic signal having a wavelength of about 760 nm (i.e. infrared light) then the attenuated light which passes through semiconductor wafer 10 will also have a wavelength of about 760 nm. The degree or magnitude of such attenuation of the intensity level of the infrared light is dependent on how much of the infrared light is absorbed by the electromagnetic radiation absorbing compound 312 present in the resist layer 16. Therefore, as the thickness of the resist layer 16 decreases due to etching thereof, the amount of radiation absorbing compound 312 present on the semiconductor wafer 10 also decreases. Therefore, the degree of attenuation or reduction of the intensity level of the infrared light likewise decreases. Hence, the intensity level of infrared light which has passed through an etched semiconductor wafer 10 is greater relative to the intensity level of infrared light which has passed through an unetched semiconductor wafer 10.

Prior to being etched to the desired level 28 (see FIG. 1C), the amount of radiation absorbing compound 312 present on the semiconductor wafer 10 causes the intensity of the infrared light from the light source unit 66 passing through semiconductor 10 to be below the intensity threshold level of the light detector 74. However, once the semiconductor wafer 10 has been etched to the desired level 28 (i.e. resist layer 16 is removed; see FIG. 1D), the intensity level of the infrared light passing therethrough, even though attenuated to some degree by the thickness of the semiconductor wafer 10, is greater in magnitude than the intensity threshold level of the light detector 74. Therefore, the light detector 74 is capable of detecting the attenuated infrared light from the light source unit 66. As shall be discussed below in more detail, such detection (or lack thereof may be used to alter operation of the etching system 30.

The etching system 30 also includes a controller 82 for controlling the etching system 30 in order to effectuate the desired etching results for the semiconductor wafer 10. In particular, the controller 82 is electrically coupled to the inlet valve 38 via a signal line 84. The controller 82 may selectively generate a control signal on the signal line 84 thereby causing the inlet valve 38 to selectively be moved between its open position and its closed position. Hence, when the controller 82 generates an output signal in order to position the inlet valve 38 in its open position, reactant gas is permitted to flow from the gas source 36 into the etching chamber 32. Conversely, when the controller 82 generates an output signal in order to position the inlet valve 38 in its closed position, the gas source 36 is isolated from the etching chamber 32 thereby preventing a flow of reactant gas into the etching chamber 32.

The controller 82 is also electrically coupled to the outlet valve 44 via a signal line 86. The controller 82 may selectively generate a control signal on the signal line 86 in order to selectively move the outlet valve 44 between its open position and its closed position. Hence, when the controller 82 generates an output signal in order to position the outlet valve 44 in its open position, reactant gas is permitted to flow from the etching chamber 32 to the gas collection device (not shown). Conversely, when the controller 82 generates an output signal in order to position the outlet valve 44 in its closed position, the etching chamber 32 is isolated from the gas disposal device thereby preventing a flow of reactant gas into the gas disposal device.

Moreover, the controller 82 is also electrically coupled to the electric field generating device 50 via a signal line 88. Hence, the controller 82 may selectively generate a control signal on the signal line 88 in order to selectively actuate and/or deactuate the electric field generating device 50 thereby selectively generating an electric field within the etching chamber 32.

The controller 82 is also electrically coupled to the infrared light source unit 66 via a signal line 90 in order to selectively actuate the light source unit 66. In particular, as shown in FIG. 2, during operation of the etching system 30, the controller 82 generates a control signal on the signal line 90 which causes the light source unit 66 to generate infrared light signals which are transmitted through the semiconductor wafer 10 and into the opening 48 of the wafer chuck 46.

The controller 82 is electrically coupled to the light detector 74 of the light receiving unit 68 via a signal line 92 in order to monitor the output therefrom. In particular, as discussed above, if the semiconductor wafer 10 has not been etched down to the desired level 28, the amount of the infrared light absorbed by electromagnetic radiation absorbing compound 312 causes the infrared light signal to be below the intensity threshold level of the light detector 74. When the light detector does not detect the infrared light, the light detector 74 of the light receiving unit 68 is operated in a non-detection mode of operation in which the light detector 74 generates a non-detection control signal which is sent to the controller 82 via the signal line 92.

However, if the semiconductor wafer 10 has been etched down to the desired level 28, the intensity level of the infrared light passing through the semiconductor wafer 10 (i.e. the infrared light signals generated by the light source unit 66) after the same has been attenuated to some degree by the semiconductor wafer 10 is above the intensity threshold level of the light detector 74. Hence, the light detector 74 of the light receiving unit 68 is operated in a detection mode of operation in which the light detector 74 generates a detection control signal to be sent to the controller 82.

A detection control signal on the signal line 92 causes the controller 82 to stop or otherwise cease etching of the semiconductor wafer 10. In particular, if the controller 82 receives a detection control signal on the signal line 92, the controller 82 positions the inlet valve 38 in its closed position so as to prevent a flow of reactant gas from advancing into the etching chamber 32 thereby ceasing etching of the front side 22 of the semiconductor wafer 10. On the other hand, a non-detection control signal on the signal line 92 causes the controller 82 to continue the etching of the semiconductor wafer 10. In particular, if the controller 82 receives a non-detection control signal on the signal line 92, the controller 82 positions the inlet valve 38 in its open position so as to allow a flow of reactant gas into the etching chamber 32 thereby ceasing etching of the front side 22 of the semiconductor wafer 10.

In operation, the etching system 30 etches the semiconductor wafer 10 in order to remove material from the front side 22 thereof. In particular, the etching system 30 removes material from the front side 22 of the semiconductor wafer 10 until the wafer 10 is etched down to the desired level 28. More specifically, the wafer chuck 46 engages the back side 24 of the semiconductor wafer 10 and positions the semiconductor wafer 10 at a predetermined position within the etching chamber 32. The controller 82 then causes the inlet valve 38 to be positioned in its open position thereby providing for a flow of reactant gas into the etching chamber 32. Thereafter, the controller 82 causes actuation of the electric field generating device 50 thereby creating an electric field within the etching chamber 32. The resulting plasma generated from the reactant gas in the presence of the electric field etches or otherwise removes material (e.g. resist layer 16) from the front side 22 of the semiconductor wafer 10.

In addition, the controller 82 selectively causes the infrared light source unit 66 to generate light signals of infrared light which are transmitted through the front side 22 of the semiconductor wafer 10. The controller 82 also monitors the output from the light detector 74 associated with the light receiving unit 68 in order to monitor the changing (i.e. decreasing) thickness of the semiconductor wafer 10 (i.e. resist layer 16). From such monitoring of the light detector 74, the controller 82 determines if the semiconductor wafer 10 has been etched to the desired level 28 and thereafter ceases etching of the wafer 10 if it has been etched to the desired level 28. In particular, if the semiconductor wafer 10 has been etched to the desired level 28, the controller 82 may (1) cause the inlet valve 38 to be positioned in its closed position thereby preventing additional reactant gas from being advanced into the etching chamber 32, (2) deactuate the electric field generating device 50 thereby removing the electric field from within the etching chamber 32, and/or (3) cause the outlet valve 44 to be positioned in its open position thereby causing the reactant gas (and the plasma generated therefrom) to be evacuated from the etching chamber 32 via the outlet 42.

Figure 3:
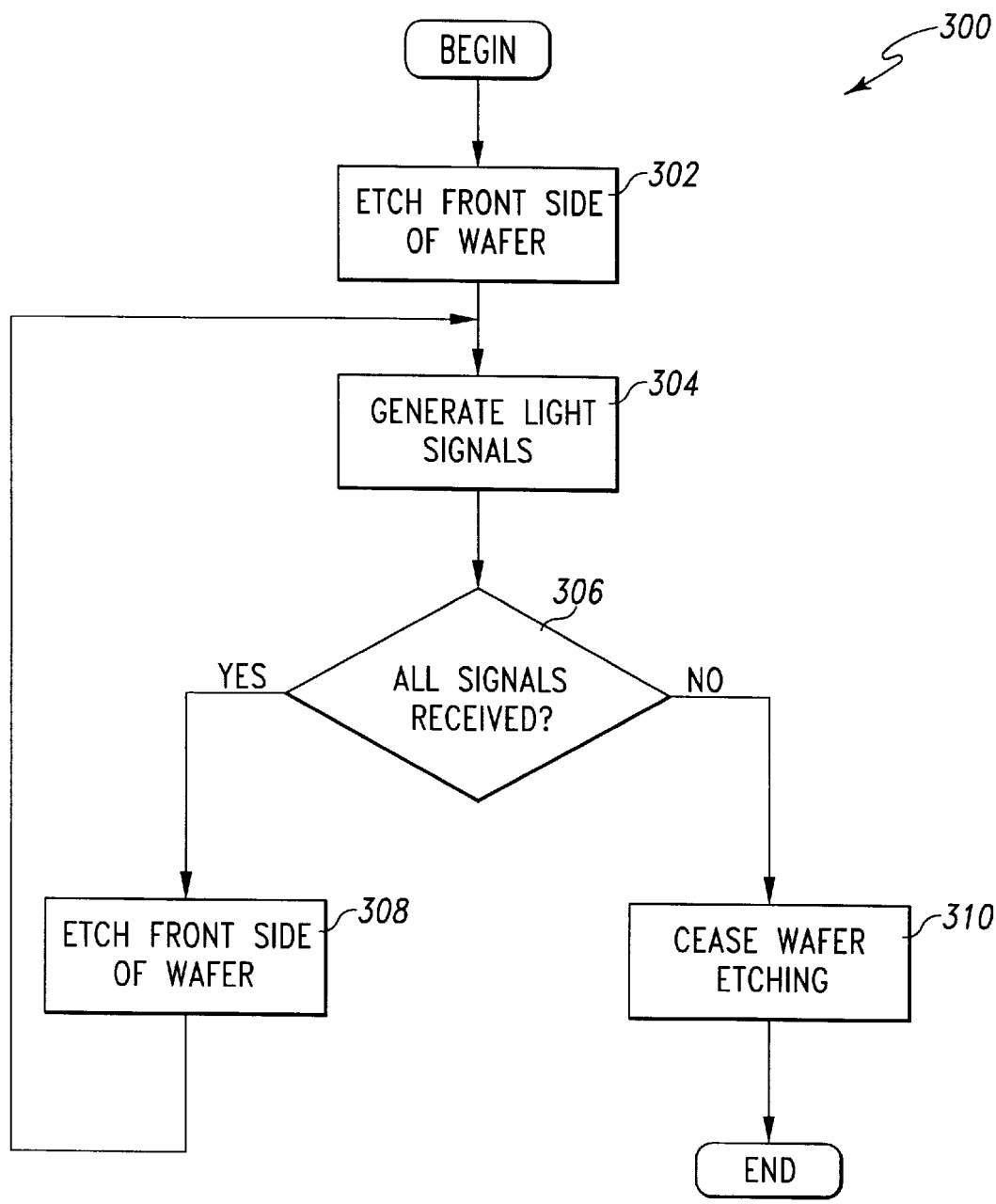
FIG. 3 shows a flowchart of an etching procedure used by the etching system of FIG. 2.

An etching procedure 300 utilized by the etching system 30 to etch the semiconductor wafer 10 according to the present invention is shown in FIG. 3. The etching procedure 300 begins with step 302 in which the controller 82 causes the etching system 30 to begin etching the front side 22 of the semiconductor wafer 10 in order to remove material therefrom. In particular, the wafer chuck 46 engages the back side 24 of the semiconductor wafer 10 and positions the semiconductor wafer 10 at a predetermined position within the etching chamber 32. The controller 82 then causes the inlet valve 38 to be positioned in its open position thereby providing for a flow of reactant gas into the etching chamber 32. Thereafter, the controller 82 causes actuation of the electric field generating device 50 thereby creating an electric field within the etching chamber 32. The resulting plasma generated from the reactant gas in the presence of the electric field etches or otherwise removes material from the front side 22 of the semiconductor wafer 10. The procedure 300 then advances to step 304.

In step 304, the controller 82 causes the light source unit 66 to generate infrared light signals. In particular, the controller 82 generates an output signal on the signal line 90 which causes the light source unit 66 to generate infrared light signals. Such infrared light signals are transmitted onto the semiconductor wafer 10 and resist layer 16 where an amount of the infrared light signals are absorbed as described above. The procedure 300 then advances to step 306.

In step 306, the controller 82 determines if the infrared light signals generated by the light source unit 66 are detected by the light receiving unit 68. In particular, as discussed above, if the semiconductor wafer 10 has not been etched to the desired level 28, infrared light corresponding to the light signals generated by the light source unit 66 are not detected by the light detector 74 of the light receiving unit 68. Hence, in step 306, if infrared light is not detected by the light detector 74 of the light receiving unit 68, the procedure 300 advances to step 308. If infrared light is detected by the light detector 74 of the light receiving unit 68, the procedure 300 advances to step 310.

In step 308, the controller 82 concludes that the semiconductor wafer 10 has not been etched to the desired level 28. This is true since the light detector 74 of the light receiving unit 68 did not detected infrared light associated with the light signals generated by the light source unit 66. Hence, in step 308, the controller 82 communicates with the inlet valve 38 and the electric field generating device 50 in order to continue etching the semiconductor wafer 10 in the manner previously discussed. The procedure 300 then loops back to step 304 in order to generate subsequent infrared light signals to monitor the decreasing thickness of the semiconductor wafer 10, and thus resist layer 16, during etching thereof.

Returning now to step 306, if infrared light is detected by the light detector 74 of the light receiving unit 68, the procedure 300 advances to step 310. In step 310, the controller 82 ceases etching of the semiconductor wafer 10. In particular, the controller 82 communicates with the gas inlet valve 38, the electric field generating device 50, and/or the outlet valve 44 in order to cease etching of the semiconductor wafer 10. More specifically, in order to stop or otherwise cease etching of the semiconductor wafer 10, the controller 82 may (1) cause the inlet valve 38 to be positioned in its closed position thereby preventing additional reactant gas from being advanced into the etching chamber 32, (2) deactuate the electric field generating device 50 thereby removing the electric field from within the etching chamber 32, and/or (3) cause the outlet valve 44 to be positioned in its open position thereby causing the reactant gas (and the plasma generated therefrom) to be evacuated from the etching chamber 32 via the outlet 42. However, it should be appreciated that the controller 82 may allow the etching system 30 to continue etching the semiconductor wafer 10 for a short, predetermined amount of time in order to further remove material from the semiconductor wafer 10. This further removal of material or overetching may be desirable after certain steps of a fabrication process. The procedure 300 then ends thereby placing the etching system 30 in an idle state until actuated to etch a subsequent semiconductor wafer.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

For example, in certain types of etching systems, it may be advantageous to utilize light signals reflected from the front side 22 of the wafer 10 instead of transmitting the light signals through the wafer 10. In such a situation, the light receiver array 64 would be positioned on the same side of the semiconductor wafer 10 as the light source array 62.

Moreover, in order to improve "across wafer" uniformity during etching, an array of gas inlets, each having an independently controlled inlet valve associated therewith, may be positioned radially at various locations over the semiconductor wafer 10 when the wafer 10 is positioned in the etching chamber. Each inlet valve could have a corresponding endpoint detector (i.e. a corresponding light source unit 66 and light receiving unit 68). In such an arrangement, individual portions (e.g. individual radial portions) of the semiconductor wafer 10 may be monitored to determine when a given portion is etched to the desired level 28. When a given portion has been etched to the desired level 28, the inlet valve corresponding to that portion (e.g. the inlet valve positioned above the portion) may be closed thereby reducing, or completely stopping, etching of the portion of the wafer 10 which has been etched to the desired level 28. Hence, such an arrangement would provide independent, multiple-point endpoint detection.

Yet further, as with the infrared light source unit 66, it should be appreciated that the light receiving unit 68 may alternatively be positioned outside of the etching chamber 32 such that infrared light signals emanating from the semiconductor wafer 10 (i.e. light signals either exiting the wafer 10 after being directed therethrough or light signals reflected from the wafer 10) are first directed through a sapphire window or the like positioned in a lower wall of the etching chamber 32 (as viewed in FIG. 2) and thereafter directed into the light receiving unit 68.

What is claimed is:

1. A method of fabricating a semiconductor wafer, comprising the steps of:

doping a resist substance with an electromagnetic radiation absorbing compound so as to form an electromagnetic radiation absorbing resist material;

forming an electromagnetic radiation absorbing resist layer on a first side of said semiconductor wafer with said electromagnetic radiation absorbing material;

subjecting said first side of said semiconductor wafer to an electromagnetic signal so that an amount of said electromagnetic signal is absorbed by said electromagnetic radiation absorbing compound present in said electromagnetic radiation absorbing resist layer such that an attenuated electromagnetic signal emanates from said semiconductor wafer;

etching said first side of said semiconductor wafer during said subjecting step in order to remove a quantity of said electromagnetic radiation absorbing resist layer from said first side of said semiconductor wafer;

determining an intensity level of said attenuated electromagnetic signal; and stopping said etching step in response to said intensity level of said attenuated electromagnetic signal having a relationship with an intensity threshold level.

2. The method of claim 1, wherein:

said electromagnetic radiation absorbing compound includes an infrared electromagnetic radiation absorbing compound, said electromagnetic signal includes an infrared electromagnetic signal, and said infrared electromagnetic signal becomes attenuated upon absorption of said infrared electromagnetic signal by infrared electromagnetic radiation absorbing compound.

3. The method of claim 2, wherein:

said infrared electromagnetic radiation absorbing compound includes 1 H-Perimidine, 2,3-dihydro-2,2-dimethyl-6-[[4-(phenylazo)-1-naphthyl]azo].

4. The method of claim 1, wherein:

said etching step includes the step of etching said first side of said semiconductor wafer with a reactant gas in an etching chamber, and said stopping step includes the step of evacuating said reactant gas from said etching chamber in response to said attenuated electromagnetic signal having said relationship with said intensity threshold level.

5. The method of claim 1, wherein:

said semiconductor wafer is positioned in an etching chamber during said etching step, said etching step includes the step of positioning a gas inlet valve in an open position so as to allow a reactant gas to flow into said etching chamber, and said stopping step includes the step of positioning said gas inlet valve in a closed position so as to prevent said reactant gas from advancing into said etching chamber.

6. The method of claim 1, wherein:

said etching step includes the step of etching said first side of said wafer in an electric field generated by a field generating device, and said stopping step includes the step of deactuating said field generating device so as to remove said electric field in response to said attenuated electromagnetic signal having said relationship with said intensity threshold level.

7. The method of claim 1, wherein said subjecting step includes the step of:

transmitting said electromagnetic signal through said first side of said semiconductor wafer so that said attenuated electromagnetic signal emanates from a second side of said semiconductor wafer.

8. The method of claim 7, wherein:

said etching step includes the step of etching said semiconductor wafer while said second side of said semiconductor wafer is secured in a wafer chuck, and said stopping step includes the step of positioning a light detector vertically below said wafer chuck such that said light detector receives said attenuated electromagnetic signal emanating from said second side of said semiconductor wafer.

9. A method of fabricating a semiconductor wafer, comprising the steps of:

forming an infrared radiation absorbing resist layer on a first side of said semiconductor wafer;

subjecting said first side of said semiconductor wafer to an infrared signal so that an amount of said infrared signal is absorbed by said infrared radiation absorbing resist layer such that an attenuated infrared signal emanates from said semiconductor wafer;

etching said first side of said semiconductor wafer during said subjecting step in order to remove a quantity of said infrared radiation absorbing resist layer from said first side of said semiconductor wafer;

determining an intensity level of said attenuated infrared signal; and stopping said etching step in response to said intensity level of said attenuated infrared signal having a relationship with an intensity threshold level.

10. The method of claim 9, wherein:

said infrared radiation absorbing resist layer includes 1 H-Perimidine, 2,3-dihydro-2,2-dimethyl-6-[[4-(phenylazo)-1-naphthyl]azo].

11. The method of claim 9, wherein:

said etching step includes the step of etching said first side of said semiconductor wafer with a reactant gas in an etching chamber, and said stopping step includes the step of evacuating said reactant gas from said etching chamber in response to said attenuated infrared signal having said relationship with said intensity threshold level.

12. The method of claim 9, wherein:

said semiconductor wafer is positioned in an etching chamber during said etching step, said etching step includes the step of positioning a gas inlet valve in an open position so as to allow a reactant gas to flow into said etching chamber, and said stopping step includes the step of positioning said gas inlet valve in a closed position so as to prevent said reactant gas from advancing into said etching chamber.

13. The method of claim 9, wherein:

said etching step includes the step of etching said first side of said wafer in an electric field generated by a field generating device, and said stopping step includes the step of deactuating said field generating device so as to remove said electric field in response to said attenuated infrared signal having said relationship with said intensity threshold level.

14. The method of claim 9, wherein said subjecting step includes the step of:

transmitting said infrared signal through said first side of said semiconductor wafer so that said attenuated infrared signal emanates from a second side of said semiconductor wafer.

15. The method of claim 14, wherein:

said etching step includes the step of etching said wafer while said second side of said semiconductor is secured in a wafer chuck, and said stopping step includes the step of positioning a light detector vertically below said wafer chuck such that said light detector receives said attenuated infrared signal emanating from said second side of said semiconductor wafer.

16. An arrangement for etching a first side of a semiconductor wafer down to a desired level, comprising:

an etching system for etching said first side of said semiconductor wafer, said etching system being operable between (i) an etching mode wherein said etching system etches said first side of said semiconductor wafer and (ii) a non-etching mode wherein said etching system stops etching said first side of said semiconductor wafer;

an electromagnetic radiation absorbing resist material disposed on said first side of said semiconductor wafer;

a light source unit for subjecting said radiation absorbing resist material to an electromagnetic signal such that (i) an amount of said electromagnetic signal is absorbed by said electromagnetic radiation absorbing resist material and (ii) an attenuated electromagnetic signal emanates from said semiconductor wafer; and a light receiving unit for receiving said attenuated electromagnetic signal, said light receiving unit being operably coupled to said etching system so that said etching system is placed in said non-etching mode when said attenuated electromagnetic signal has a relationship with an intensity threshold level.

17. The arrangement of claim 16, wherein:

said electromagnetic radiation absorbing resist material includes an infrared electromagnetic radiation absorbing compound, said electromagnetic signal includes an infrared electromagnetic signal, and said infrared electromagnetic signal becomes attenuated upon absorption of said infrared electromagnetic signal by infrared electromagnetic radiation absorbing compound.

18. The arrangement of claim 16, wherein:

said etching system includes a gas inlet valve, said gas inlet valve is fluidly coupled to (i) a reactant gas source, and (ii) an etching chamber, said gas inlet valve is positionable between (i) an open position in which said reactant gas is advanced from said reactant gas source to said etching chamber, and (ii) a closed position in which said reactant gas source is isolated from said etching chamber, and said gas inlet valve is positioned in said closed position when said attenuated electromagnetic signal has said [predetermined] relationship with said intensity threshold level.

19. The arrangement of claim 18, wherein:

said etching system further includes an electric field generating device, said electric field generating device is operable in either (i) an actuated mode of operation in which said electric field generating device generates an electric field within said etching chamber, or (ii) a deactuated mode of operation in which said electric field generating device does not generate said electric field within said etching chamber, and said electric field generating device is operated in said deactuated mode of operation position when said attenuated electromagnetic signal has said relationship with said intensity threshold level.

20. The arrangement of claim 16, wherein:

said etching system includes a wafer chuck for securing said semiconductor wafer, and said light receiving unit is positioned vertically below said wafer chuck such that said light receiving unit receives said attenuated electromagnetic signal emanating from said semiconductor wafer.

* * * * *